(12) United States Patent
Zablocki et al.

(10) Patent No.: US 9,629,288 B2
(45) Date of Patent: Apr. 18, 2017

(54) LIGHTNING PROTECTION AND ENHANCED EMI SHIELDING FOR FACETED DOMES

(71) Applicant: BAE SYSTEMS INFORMATION AND ELECTRONIC SYSTEMS INTEGRATION INC., Nashua, NH (US)

(72) Inventors: Edward G. Zablocki, North Andover, MA (US); James A. Cirillo, Windham, NH (US); Donald W. Clarke, Hudson, NH (US)

(73) Assignee: BAE Systems Information and Electronic Systems Integration Inc., Nashua, NH (US)

( * ) Notice: Subject to any disclaimer, the term of this patent is extended or adjusted under 35 U.S.C. 154(b) by 551 days.

(21) Appl. No.: 13/867,147

(22) Filed: Apr. 22, 2013

(65) Prior Publication Data

US 2014/0192507 A1    Jul. 10, 2014

Related U.S. Application Data

(60) Provisional application No. 61/638,188, filed on Apr. 25, 2012.

(51) Int. Cl.
*H05K 9/00* (2006.01)
*G01J 1/02* (2006.01)
*G01J 1/04* (2006.01)

(52) U.S. Cl.
CPC .......... *H05K 9/0058* (2013.01); *G01J 1/0271* (2013.01); *G01J 1/04* (2013.01); *G01J 2001/0276* (2013.01); *G01J 2001/0285* (2013.01)

(58) Field of Classification Search
CPC .................................. G01J 1/0271; G01J 1/04
USPC .................. 174/350–397, 520–565; 361/818
See application file for complete search history.

(56) References Cited

U.S. PATENT DOCUMENTS

| | | | |
|---|---|---|---|
| 6,433,742 B1* | 8/2002 | Crawford | H01Q 1/242 343/700 MS |
| 6,787,696 B2* | 9/2004 | Liljevik | H05K 9/0073 174/371 |
| 6,924,772 B2* | 8/2005 | Kiernan et al. | 343/725 |
| 2006/0221591 A1* | 10/2006 | Kong | 361/818 |

OTHER PUBLICATIONS

Defintion of facet by Merriam-Webster.*
Wikipedia Definition of "Antenna".*

* cited by examiner

*Primary Examiner* — Steven T Sawyer
*Assistant Examiner* — Ahmad D Barnes
(74) *Attorney, Agent, or Firm* — Global IP Services, PLLC

(57) ABSTRACT

A faceted dome assembly for airborne optical sensors to enhance EMI shielding and lightning protection is disclosed. In one embodiment, the faceted dome assembly includes a faceted dome. An optical sensor and a gimbal are housed in the faceted dome. Further, a conductor is disposed substantially in the facets of the faceted dome to provide the enhanced electromagnetic shielding and lightning protection.

12 Claims, 3 Drawing Sheets

LIGHTNING PROTECTION AND ENHANCED EMI SHIELDING FOR FACETED DOMES

CROSS-REFERENCE TO RELATED APPLICATIONS

This Application claims rights under 35 USC §119(e) from U.S. application 61/638,188 filed Apr. 25, 2012, the contents of which are incorporated herein by reference.

STATEMENT OF GOVERNMENT INTEREST

This invention was made with United States Government support under Contract No. HSSCHQ-04-C-00342 awarded by the Department of Homeland Security. The United States Government has certain rights in this invention.

BACKGROUND OF THE INVENTION

Field of the Invention

The present invention relates to airborne optical sensors and more particularly to domes used to cover airborne optical sensors.

Brief Description of Related Art

Faceted domes are preferred over single piece domes, such as hemispherical domes or hyper hemispherical domes for use as apertures and for housing airborne optical sensors, such as infrared countermeasure systems in order to keep costs down. Basically, faceted domes are a lower cost solution over the single piece domes. Such domes invariably require protection from direct lightning strikes and from electromagnetic interference (EMI). Such domes may be used to improve performance relative to the RE102 test which is a U.S. Department of Defense Military Standard for magnetic field testing and relative to RE103 which is the U.S. Department of Defense Military Standard for Antenna and Harmonic Outputs.

Existing methods apply a layer of conductive material over the faceted domes to protect any housed electronic circuits from lighting strikes and EMI. However, this may result in significantly reducing optical transmittal properties.

SUMMARY OF THE INVENTION

A faceted dome assembly having improved lighting protection and enhanced EMI shielding is disclosed. According to one aspect of the present subject matter, the faceted dome assembly includes a faceted dome and an airborne optical sensor and a gimbal housed in the faceted dome. A conductor disposed substantially within the facets of the faceted dome to provide an enhanced electromagnetic shielding and lightning protection to the electronics in the airborne optical sensor.

BRIEF DESCRIPTION OF THE DRAWINGS

The advantages and features of the present disclosure will become better understood with reference to the following detailed description and claims taken in conjunction with the accompanying drawings, wherein like elements are identified with like symbols, and in which:

DETAILED DESCRIPTION OF THE INVENTION

The exemplary embodiments described herein in detail for illustrative purposes are subject to many variations in structure and design.

The terms "glue", "bond" and "epoxy" are used interchangeably throughout the document. Also, the terms "optical sensor" and "optical airborne sensor" are used interchangeably throughout the document. Further, the terms "wire cage", "metal cage" and "metal grid" are used interchangeably throughout the document.

Figure 1:
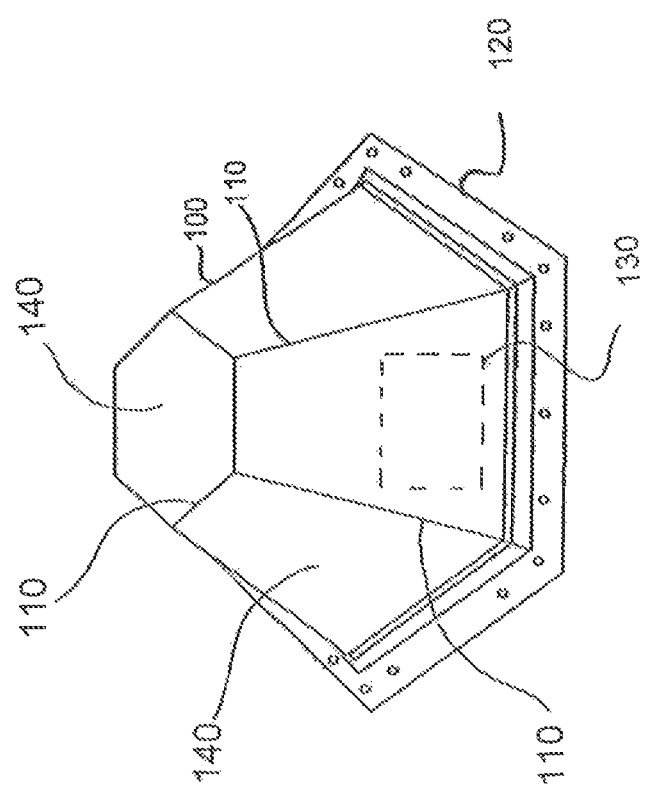
FIG. 1 illustrates an example silicon faceted dome, used for housing airborne optical sensors, such as optical and/or infrared countermeasure systems, in the context of the present subject matter.

FIG. 1 illustrates an example silicon faceted dome 100, used for housing airborne optical sensors 130 (only one of which is diagrammatically shown), such as a gimbal of an airborne optical and/or infrared countermeasure system, in the context of the present subject matter. As shown in FIG. 1, the faceted dome 100 has plurality of facets 140 bonded along mating facet edges 110, such as glue lines or glue joins, and a base 120. Exemplary airborne optical sensors include an optical sensor, an infrared optical sensor, an optical countermeasures system, an infrared countermeasures system, ultraviolet (UV) based optical sensor, visible shortwave infrared (SWIR) sensor, and/or visible longwave infrared (SWIR) sensor.

Figure 2B:
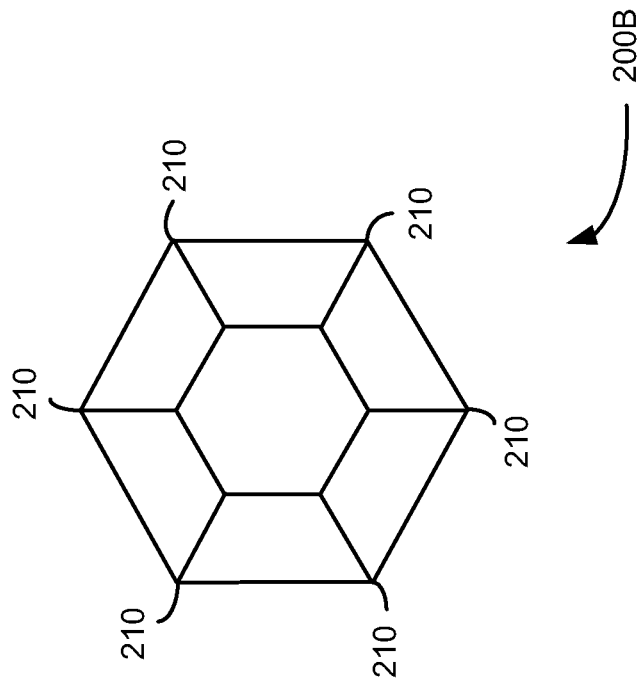
FIGS. 2A and 2B illustrate an edge view and top down view of a wire cage assembly configured to be placed over the faceted dome, shown in FIG. 1, to provide conductive paths, according to an embodiment of the present subject matter.
Figure 2A:
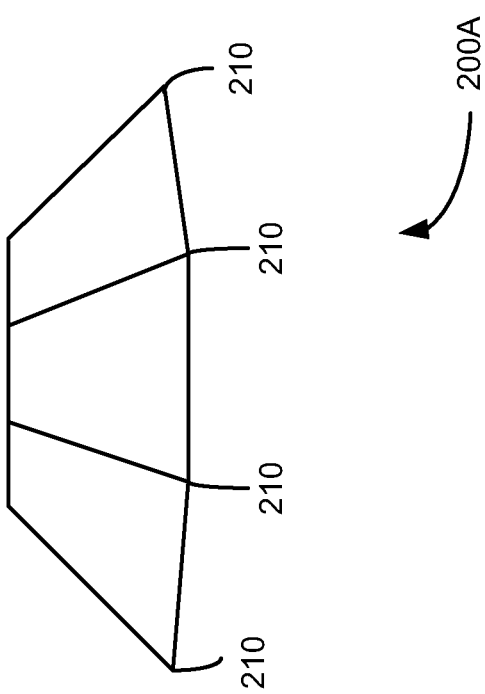

Referring now to FIG. 2A and 2B, which illustrate an edge view and a top down view of a wire cage assembly configured to be placed over the faceted dome, shown in FIG. 1, to provide conductive paths, according to an embodiment of the present subject matter. As shown in FIGS. 2A and 2B, the wire cage 200A and 200B includes ground attachment points 210 to facilitate EMI and lightning protection. The wire cage assembly is made of at least one conductive material. Exemplary conductive materials include a conductive epoxy, metal grid/wire cage configured to be disposed in the glue located within the mating facet edges 110 and a metal cage configured to be disposed on the glue line of the mating facet edges 110.

It can be seen in FIGS. 2A and 2B that the shape of the wire cage 200 is configured to be disposed substantially within the facets of the faceted dome to provide an enhanced electromagnetic shielding and lightning protection. It can be further seen that such a wire cage 200 does not affect the optical throughput of the faceted dome 100. In some embodiments, the conductor is made from a material, which acts as a faraday cage, providing high attenuation conductive properties at low frequency and longer wavelengths. In these embodiments, the low frequency is in the range of about 1 to 60 megahertz (MHz).

In some embodiments, the metal cage 200 is made from a wire having a standard wire gauge range, such as American wire gauge (AWG) ranges of about 1-40. In these embodiments, the wire gauge size is chosen to handle a desired current density during EMI and lightning strikes.

Figure 3:
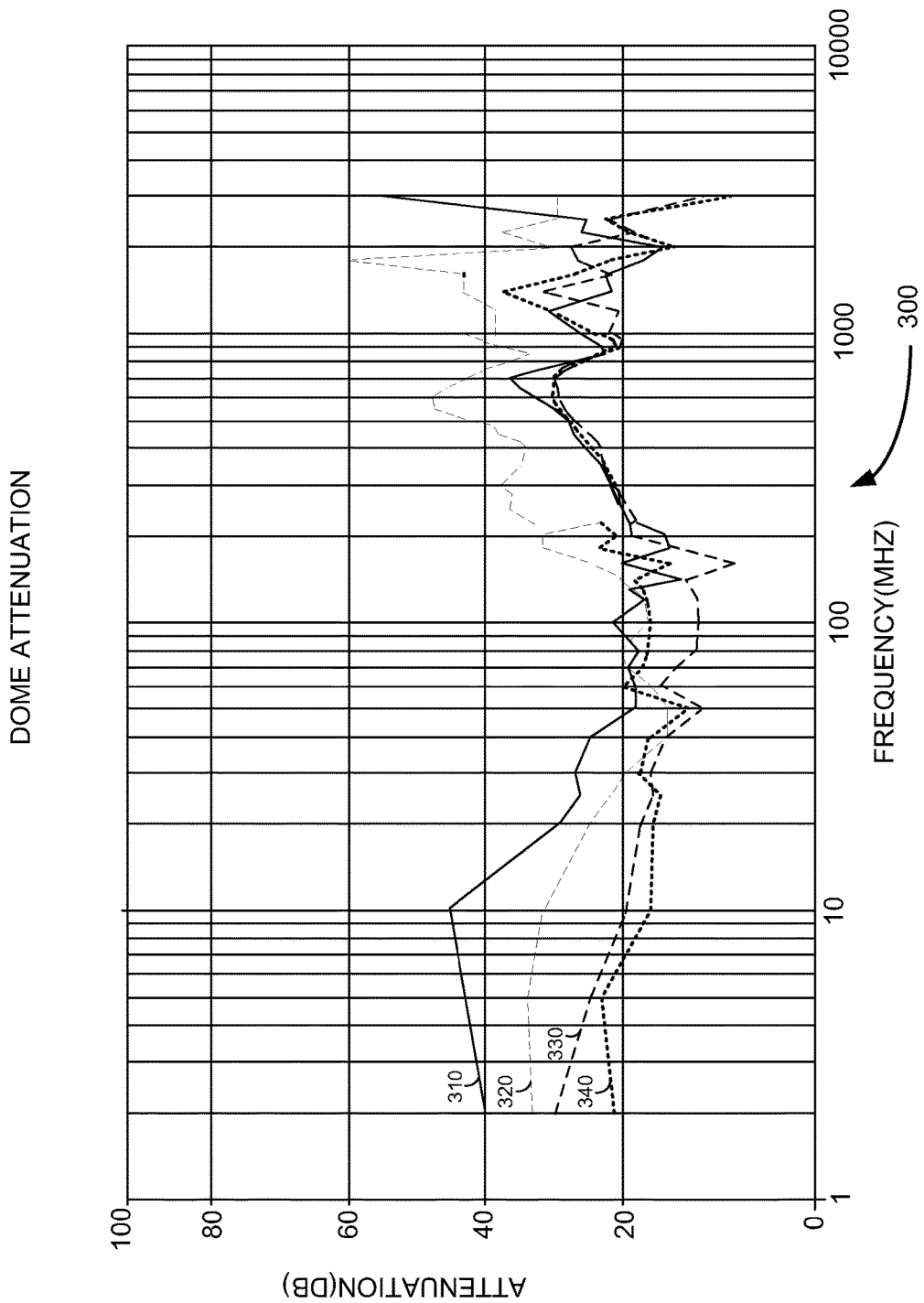
FIG. 3 is a graph illustrating test results on the faceted dome, such as those shown in FIG. 1, without conductive epoxy bonds, with conductive epoxy bonds, and with the wire cage, such as those shown in FIG. 2, according to an embodiment of the present subject matter.

Referring now to FIG. 3, which a is a graph illustrating test results on the faceted dome, such as those shown in FIG.

1, without conductive epoxy bonds, with conductive epoxy bonds, and with the wire cage, such as those shown in FIG. 2, according to an embodiment of the present subject matter. The graph 300 in FIG. 3 shows EMI test results done on the faceted dome 100. The line 340 in the graph 300 shows EMI test results done on a faceted dome 100 assembled without any conductive epoxy bonds. The line 330 in the graph 300 shows EMI test results done on a reworked faceted dome with conductive epoxy bonds. The line 320 in the graph 300 shows EMI test results done on a hyper hemispheric dome that including a conductive coating. Finally, the line 310 in the graph 300 shows EMI test results done on the faceted dome 100 including a wire cage 200 disposed within the facets, shown in FIGS. 1, 2A and 2B. It can be seen that the faceted dome including the wire cage 200 provides 40 dB attenuation in the 0 to 10 MHz frequency range and about 30-20 dB attenuation in the 10-100 MHz frequency range.

In the lightning tests, the faceted dome 100 with the wire cage 200 disposed within the bond lines was conducted and the test results are as follows:

Test 1: Large Gauge Wires (~12 AWG)—Survived lightning attachment, wires deformed, dome unscathed.
Test 2: Large Gauge Wires (~18 AWG)—One wire (leg) vaporized by lightning attachment, dome largely unscathed.
Test 3: No wire cage—lightning attachment penetrates dome, dome suffered significant discoloration and optical degradation.

Those skilled in the art will understand from the above test results that the EMI performance of the faceted dome 100 with the wire cage 200 attached at bond lines improved by as much as 40 dB in the 0 to 10 MHz frequency range. It can also be seen from the above test results that the lightning performance was also successful, particularly with a thicker conductor, i.e. with 12 AWG.

The above technique takes advantage of physical characteristics of the faceted domes in order to enhance their EMI shielding and lightning protection without compromising the electro-optical performance. This is accomplished by disposing a metal cage over the faceted dome wedge and/or glue lines to provide the needed shielding to enhance EMI and lightning protection.

The foregoing descriptions of specific embodiments of the present disclosure have been presented for purposes of illustration and description. They are not intended to be exhaustive or to limit the present disclosure to the precise forms disclosed, and obviously many modifications and variations are possible in light of the above teaching. The embodiments were chosen and described in order to best explain the principles of the present disclosure and its practical application, to thereby enable others skilled in the art to best utilize the present disclosure and various embodiments with various modifications as are suited to the particular use contemplated. It is understood that various omission and substitutions of equivalents are contemplated as circumstance may suggest or render expedient, but such are intended to cover the application or implementation without departing from the spirit or scope of the claims of the present disclosure.

What is claimed is:

1. A faceted dome assembly for covering an airborne optical sensor and providing an enhanced electromagnetic shielding and lightning protection, the faceted dome assembly comprising:
   a silicon faceted dome configured to house and cover the optical sensor; and
   a base;
   wherein the faceted dome comprises a plurality of facets, and each of the plurality of facets mating with adjacent facets along mating facet edges, and the mating facet edges are secured together by glue;
   a conductor configured as a Faraday cage is disposed substantially within and extends along all of the glued facet edges of the faceted dome for providing the enhanced electromagnetic shielding and lightning protection for the optical sensor without compromising optical throughput of the silicon faceted dome and provides attenuation of EMI (electromagnetic interference) of about 40 dB in the 0 to 10 MHz range.

2. The faceted dome assembly of claim 1, wherein the conductor is selected from the group consisting of:
   a conductive epoxy,
   a metal grid disposed within the glue securing the facet edges together; and
   a metal cage disposed on the glue securing the facet edges together.

3. The faceted dome assembly of claim 1, wherein the conductor has high attenuation conductive properties at low frequency and longer wavelengths.

4. The faceted dome assembly of claim 3, wherein the low frequency is in the range of about 1 to 60 megahertz (MHZ).

5. The faceted dome assembly of claim 2, wherein the metal cage is made from a wire having an American wire gauge (AWG) range of about 1-40.

6. The faceted dome assembly of claim 1, wherein the conductor is configured to handle a desired current density.

7. The faceted dome assembly of claim 1, wherein the optical sensor is selected from the group consisting of an ultraviolet (UV) sensor, a shortwave infrared (SIR) sensor, a longwave infrared (LWIR) sensor, an optical countermeasures system, and an infrared countermeasures system.

8. A faceted dome assembly covering and protecting at least one airborne optical sensor, the faceted dome assembly comprising:
   a silicon faceted dome for housing and covering the at least one airborne optical sensor; and
   a base;
   wherein the faceted dome comprises a plurality of facets, and each of the plurality of facets mating with adjacent facets along mating facet edges, and the mating facet edges are secured together by glue;
   a conductor, configured as a metal cage, is disposed substantially along all of the glued facet edges of the faceted dome for providing the enhanced electromagnetic shielding and lightning protection for electronics in the at least one airborne optical sensor without compromising optical throughput of the faceted dome and provides attenuation of EMI (electromagnetic interference) of about 40 dB in the 0 to 10 MHz range.

9. The faceted dome assembly of claim 8, wherein the conductor has high attenuation conductive properties at low frequency and longer wavelengths.

10. The faceted dome assembly of claim 9, wherein the low frequency is in the range of about 1 to 60 megahertz (MHZ).

11. The faceted dome assembly of claim 8, wherein the metal cage if made from a wire having AWG ranges of about 1-40.

12. The faceted dome assembly of claim 8, wherein the conductor is configured to handle a desired current density.

* * * * *